(12) United States Patent
Campbell et al.

(10) Patent No.: US 8,937,401 B2
(45) Date of Patent: Jan. 20, 2015

(54) VEHICLE WITH DRIVE SYSTEM PROVIDING REDUCED EMISSIONS

(75) Inventors: Jeremy B. Campbell, Torrance, CA (US); Mark Andrew Steffka, Canton, MI (US); Nicholas Hayden Herron, Redondo Beach, CA (US)

(73) Assignee: GM Global Technology Operations LLC, Detroit, MI (US)

(*) Notice: Subject to any disclaimer, the term of this patent is extended or adjusted under 35 U.S.C. 154(b) by 917 days.

(21) Appl. No.: 13/099,182

(22) Filed: May 2, 2011

(65) Prior Publication Data
US 2012/0279790 A1   Nov. 8, 2012

(51) Int. Cl.
| | |
|---|---|
| B60L 1/00 | (2006.01) |
| H05K 9/00 | (2006.01) |
| B60L 3/00 | (2006.01) |
| B60L 11/12 | (2006.01) |
| B60K 17/22 | (2006.01) |
| B60K 17/356 | (2006.01) |

(52) U.S. Cl.
CPC . *H05K 9/002* (2013.01); *B60L 3/00* (2013.01); *B60L 11/12* (2013.01); *B60K 17/22* (2013.01); *B60K 17/356* (2013.01); *B60L 2270/147* (2013.01); *Y02T 10/7077* (2013.01); *Y02T 10/7022* (2013.01)
USPC ......... 307/9.1; 307/10.1; 307/10.2; 307/10.3; 307/10.6; 180/65.245; 180/65.22; 320/166; 320/167; 320/123; 192/85.01; 192/48.1; 310/90; 310/71; 310/51

(58) Field of Classification Search
CPC . Y02T 10/7005; Y02T 10/7077; B60R 16/03; B60R 16/0315; B60L 11/14
USPC ............... 307/9.1–10.6; 180/65.245, 65.22; 320/167; 310/51; 192/66.2, 48.1; 477/168
See application file for complete search history.

(56) References Cited

U.S. PATENT DOCUMENTS

| | | | |
|---|---|---|---|
| 3,808,481 A | 4/1974 | Rippel | |
| 4,035,697 A * | 7/1977 | Arnold, Jr. | 361/289 |
| 5,486,748 A | 1/1996 | Konrad et al. | |
| 5,604,672 A | 2/1997 | Yoshida et al. | |
| 6,236,184 B1 | 5/2001 | Baker | |
| 6,420,793 B1 * | 7/2002 | Gale et al. | 290/34 |

(Continued)

FOREIGN PATENT DOCUMENTS

| | | |
|---|---|---|
| CN | 101688565 A | 3/2010 |
| CN | 201544787 U | 8/2010 |
| JP | 2008223644 A | 9/2008 |

OTHER PUBLICATIONS

State Intellectual Property Office of the Peoples' Republic of China, Office Action for Chinese Patent Application No. 201210131738.2, mailed Jul. 18, 2014.

*Primary Examiner* — Rexford Barnie
*Assistant Examiner* — Jagdeep Dhillon
(74) *Attorney, Agent, or Firm* — Ingrassia Fisher & Lorenz, P.C.

(57) ABSTRACT

In accordance with exemplary embodiments, a drive system is provided for an electric or hybrid electric vehicle that provides reduces electromagnetic emissions. The system includes, but is not limited to, an electric motor and a transmission having a collar for receiving a portion of a drive shaft. The collar has an inside diameter proportioned to an outside diameter of the drive shaft to cause capacitive coupling between the transmission and the drive shaft thereby reducing electromagnetic emissions along the drive shaft.

19 Claims, 3 Drawing Sheets

(56) References Cited

U.S. PATENT DOCUMENTS

| | | |
|---|---|---|
| 7,659,684 B2 | 2/2010 | Patel et al. |
| 2003/0140718 A1 | 7/2003 | Nett |
| 2005/0162015 A1* | 7/2005 | Yamaguchi et al. .......... 307/10.1 |
| 2007/0058311 A1 | 3/2007 | Raiser |
| 2008/0088187 A1* | 4/2008 | Shao et al. ...................... 310/51 |
| 2009/0023306 A1 | 1/2009 | Korich et al. |
| 2010/0147644 A1 | 6/2010 | Grogg et al. |
| 2011/0087392 A1* | 4/2011 | Kshatriya ....................... 701/22 |
| 2011/0127135 A1* | 6/2011 | Grogg et al. .................. 192/48.1 |
| 2011/0174561 A1* | 7/2011 | Bowman .................. 180/65.245 |
| 2012/0056600 A1* | 3/2012 | Nevin ............................ 320/167 |
| 2012/0065023 A1* | 3/2012 | Christman et al. ............. 477/168 |

* cited by examiner

US 8,937,401 B2

VEHICLE WITH DRIVE SYSTEM PROVIDING REDUCED EMISSIONS

TECHNICAL FIELD

The technical field generally relates to systems and methodologies for a drive system for electric and hybrid electric vehicle, and more particularly, to systems and methodologies for a drive system that provides reduced electromagnetic emissions.

BACKGROUND

Electric and hybrid vehicles typically include alternating current (AC) electric motor(s) that are driven by a direct current (DC) power source, such as a high voltage battery pack. The battery pack provides direct current to inverter module(s), which perform a rapid switching function to convert the DC power to AC power which drives the AC electric motor(s).

The rapid switching of the inverters can also produce electromagnetic interference (EMI) that is manifested as conducted interference or radiated emissions that may impede the proper operation of radio receiving or other electronic equipment in the vehicle. Additionally, EMI may be radiated from the vehicle to the surrounding environment, which may exceed permitted EMI levels in some countries. Accordingly, it is desirable to provide a simple, reliable and cost effective solution to EMI emissions in electric or hybrid electric vehicles. Additionally, other desirable features and characteristics of the present invention will become apparent from the subsequent description taken in conjunction with the accompanying drawings and the foregoing technical field and background.

BRIEF SUMMARY

In accordance with an exemplary embodiment, a drive system is provided for an electric or hybrid electric vehicle that provides reduces electromagnetic emissions. The system comprises an electric motor and a transmission having a collar for receiving a portion of a drive shaft. The collar has an inside diameter proportioned to an outside diameter of the drive shaft to cause capacitive coupling between the transmission and the drive shaft thereby reducing electromagnetic emissions along the drive shaft.

In accordance with another exemplary embodiment, a drive system is provided for an electric or hybrid electric vehicle that provides reduces electromagnetic emissions. The system comprises an electric motor and a transmission coupled to a drive shaft. A bushing is coupled to the transmission and extends around at least a portion of the drive shaft. The bushing has an inside diameter proportioned to an outside diameter of the drive shaft to cause capacitive coupling between the transmission and the drive shaft thereby reducing electromagnetic emissions along the drive shaft.

DESCRIPTION OF THE DRAWINGS

The inventive subject matter will hereinafter be described in conjunction with the following drawing figures, wherein like numerals denote like elements, and.

DETAILED DESCRIPTION

The following detailed description is merely exemplary in nature and is not intended to limit the subject matter of the disclosure or its uses. Furthermore, there is no intention to be bound by any expressed or implied theory presented in the preceding technical field, background, brief summary or the following detailed description.

Figure 2:
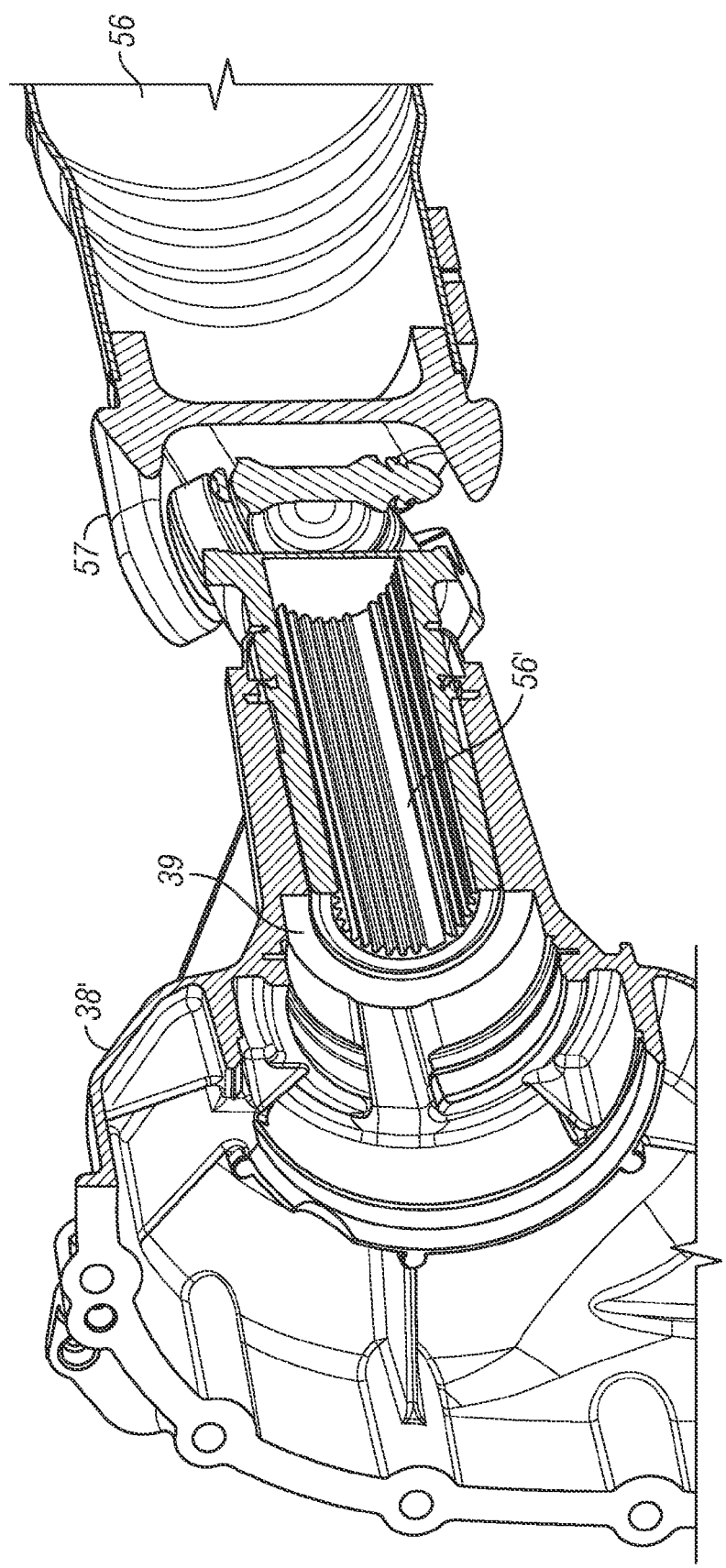
FIG. 2 is illustration of transmission case suitable for use in the vehicle of FIG. 1 in accordance with an exemplary embodiment.
Figure 3:
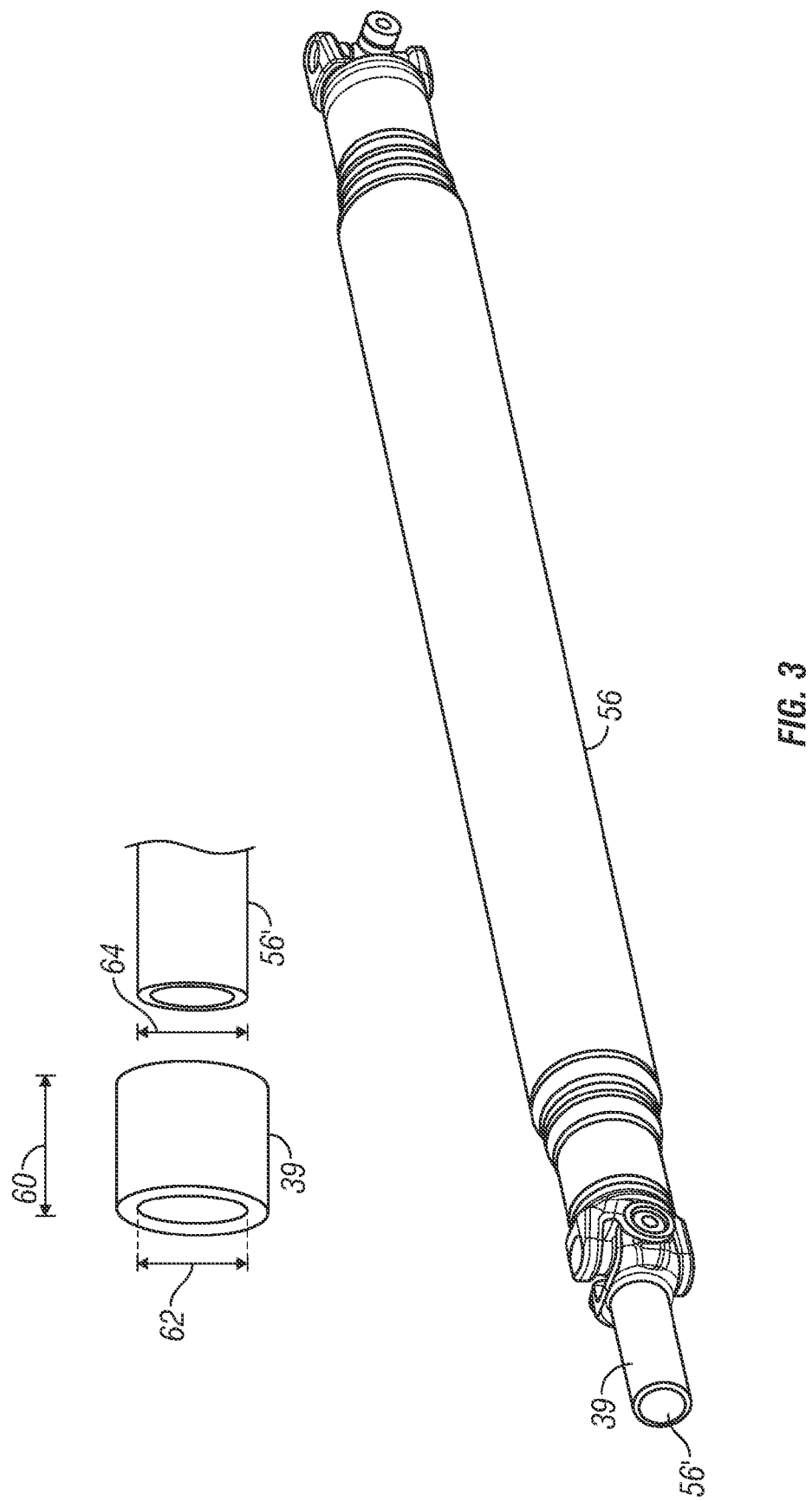
FIG. 3 is an illustration of collar or bushing suitable for use with the transmission case of FIG. 2.

The following description refers to elements or features being "connected" or "coupled" together. As used herein, "connected" may refer to one element/feature being directly joined to (or directly communicating with) another element/feature, and not necessarily mechanically. Likewise, "coupled" may refer to one element/feature being directly or indirectly joined to (or directly or indirectly communicating with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment. It should also be understood that FIGS. 1-3 are merely illustrative and may not be drawn to scale.

Figure 1:
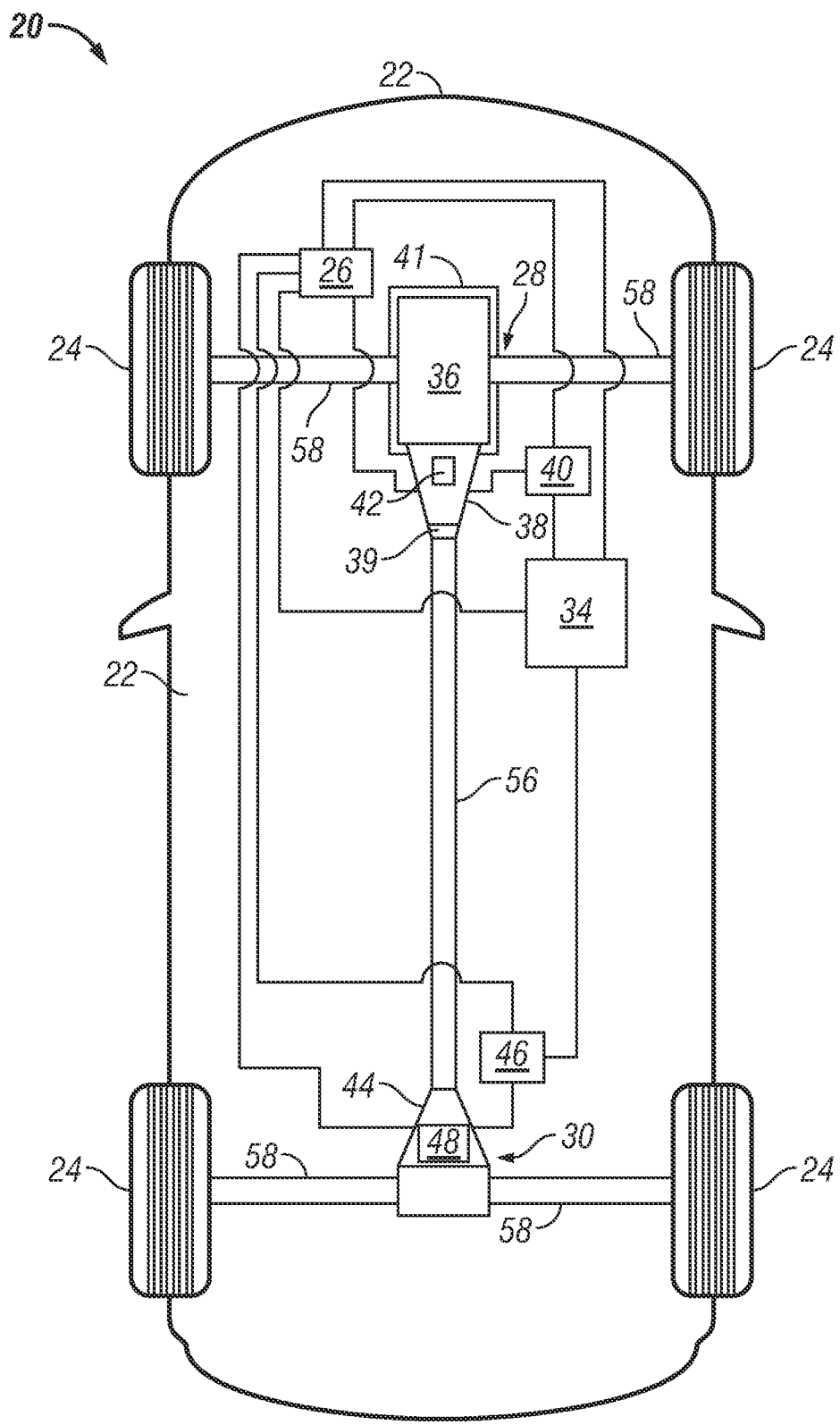
FIG. 1 is an illustration of a vehicle according to an exemplary embodiment.

FIG. 1 illustrates a hybrid electric vehicle 20, according to one embodiment. The vehicle 20 may be any one of a number of different types of vehicle, such as, for example, a sedan, a wagon, a truck, or a sport utility vehicle (SUV), and may be two-wheel drive (2WD), four-wheel drive (4WD), or all-wheel drive (AWD). The vehicle 20 may also incorporate any one of, or combination of, a number of different types of engines, such as, for example, a gasoline or diesel fueled combustion engine, a flex fuel vehicle (FFV) engine (i.e., using a mixture of gasoline and alcohol), a gaseous compound (e.g., hydrogen and/or natural gas) fueled engine, a combustion/electric motor hybrid engine, and an electric motor.

In the exemplary embodiment of FIG. 1, the vehicle 20 includes a frame 22, four wheels 24, and an electronic control system 26. Although not specifically shown, the frame includes a chassis and a body arranged on the chassis that substantially encloses the other components of the vehicle 20. The wheels 24 are each rotationally coupled to the frame 22 near a respective corner. While FIG. 1 depicts various electrical and mechanical connections and couplings in a very simplified manner for ease of description, an actual embodiment of vehicle 20 will of course utilize additional physical components and devices that are well known in the automotive industry.

As illustrated in FIG. 1, the vehicle 20 is an AWD hybrid electric vehicle, and further includes a forward actuator 28 coupled to a rear actuator assembly 30 by a drive shaft 56, and each of the actuators 28 and 30 are coupled to the wheels 24 through multiple axles 58. The forward actuator 28 includes an internal combustion engine 36, a forward motor/transmission assembly 38, a forward power inverter 40 and a lubricating fluid reservoir 41. The rear actuator 30 includes a rear motor/transmission assembly 44 and a rear power inverter 46. The electronic control system 26 is in operable communication with a forward actuator assembly 28, the rear actuator 30, a battery 34 and inverters 40 and 46. Although not shown in detail, the electronic control system 26 includes various sensors and automotive control modules, or electronic control units (ECUs) used for reliable and safe operation of the vehicle 20.

The forward motor/transmission assembly 38 includes a collar 39, which may be integrally formed into the case of the forward motor/transmission assembly 38 or may be a separate piece (e.g., bushing) mechanically and electrically coupled to the forward motor/transmission 38. The collar 39 has an inside diameter proportioned to be slightly larger than the outside diameter of the drive shaft 56, or at least a portion thereof, such as the slip yoke (discussed in more detail in FIG. 2), which allows the drive shaft 56 to move as necessary as the suspension (not shown) of the vehicle 20 works during operation. The proportioning of the collar (or bushing) 39 and drive shaft 56 (or slip yoke) creates a gap, which causes capacitive coupling between the drive shaft 56 and the forward motor/transmission 38. The capacitive coupling shunts high frequency currents to chassis (ground) that would otherwise travel along the drive shaft 56 producing electromagnetic radiation or interference (EMI).

Referring now to FIG. 2, the casing 38' of the forward motor/transmission assembly 38 is shown to include an integral collar 39, which surrounds at least a portion of the slip yoke 56' of the drive shaft 56. Typically, a universal joint 57 couples the drive shaft 56 to the slip yoke 56' which allows the length of the drive shaft to extend or contract (by virtue of the slip yoke moving in or out of the casing 38') to compensate for the operation of the vehicle's suspension system.

As previously mentioned, the inverters (40 and 46 of FIG. 1) may cause electromagnetic currents due to the rapid switching operation of the inverters. Such currents would tend to travel along the drive shaft 56, which may form an antenna (due to the partial inductance of the drive shaft 56) that radiates electromagnetic energy (EMI) into the vehicle's various electronic systems and/or into the surrounding environment. Conventional approaches to reducing EMI include coupling (bolting) conductive cables to various chassis (vehicle ground) points. However, this practice is labor intensive and the cables may degrade with age or fail over the life of the vehicle.

According to various embodiments, capacitive coupling is created between the casing 38' and the drive shaft 56 (or slip yoke 56') that shunts such currents to chassis (i.e., ground), which provides benefits such as the reduction of EMI. The capacitive coupling is created by a controlled gap formed between the casing 38' and the drive shaft 56 by proportional control of the inside diameter of the collar (or bushing) 39 and outside diameter of the slip yoke 56'. Capacitive coupling is possible by providing a lower impedance path for the current than the drive shaft 56 impedance caused by the partial inductance, which can be expressed as:

$$L = \left(\frac{\mu l}{2\pi}\right)\left[\frac{\ln 2l}{r} - 1\right] \quad (1)$$

where:
l is the length of the drive shaft 56;
r is the radius of the drive shaft 56
μ is permeability of air.

In one embodiment, the casing 38' has the collar 39 formed integrally into the casing 38'. This can be done by precision drilling or boring to tolerances that will be discussed in conjunction with FIG. 3. The capacitive coupling is designed to provide a low impedance path to chassis (ground) at the frequency of interest to be reduced or eliminated for control of EMI. Thus, various interfering signals can be reduced or eliminated by control of the diameters of the capacitive interface between the collar 39 and the slip yoke 56'.

Referring to FIG. 3, a more detailed illustration of the collar or bushing 39 is shown along with its interface to the slip yoke 56' of the drive shaft 56. The collar or bushing 39 may extend around all or a portion of the slip yoke 56' to create the capacitive interface there between. Although the slip yoke 56' is illustrated for convenience as a cylinder, it will be appreciated that a commercial embodiment of slip yoke will have a grooved or ribbed surface that couples to a mating interface in the forward motor/transmission (38 of FIG. 1).

In the embodiment illustrated in FIG. 3, the collar 39 may be formed as a separate piece (bushing), which would be mechanically and electrically coupled to the casing (38' of FIG. 2) such as by press-fitting, bolting or any other suitable coupling mechanism. In an exemplary embodiment, the bushing 39 has a nominal length 60 of 154 mm (which would be the nominal depth if bored into the case 38' in an integrated embodiment), the inside diameter 62 of the bushing (or collar) 39 is nominally 102 mm, and the outside diameter 64 of the slip yoke 56' is nominally 101.8 mm. The proportions of these dimensions creates a gap between the slip yoke 56' and the bushing (or collar) 39 of 0.1 mm. The proportional ratios creates a capacitance, which may be determined as:

$$C = \left(\frac{2\pi\varepsilon L}{\ln b/a}\right) \quad (2)$$

where:
ε is the permittivity of air;
L is the length 60 of the collar 39;
a is the inside diameter 62 of the collar 39; and
b is the outside diameter 64 of the slip yoke 56'.

From equation (2), it will be appreciated that an equivalent capacitance of approximately 8.5 nf is created, which provides a low impedance path of approximately 1.9 ohms to chassis (i.e., ground) at 1 MHz. By using other dimensions, other capacitive values and low impedance paths to chassis can be created depending upon the frequency of interest to be reduced or eliminated. The capacitive coupling at the interface between the collar 39 and the slip yoke 56' is generally of low cost and reliable as there are no additional moving parts or aging parts. The embodiments of the present disclosure thus provide a simple, effective and reliable way to reduce or eliminate EMI in electric or hybrid electric vehicles.

While at least one exemplary embodiment has been presented in the foregoing summary and detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing summary and detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:
1. A vehicle, comprising:
an electric motor;
an inverter electrically coupled to the electric motor and providing power to the electric motor;

a drive shaft having an outside diameter; and a transmission mechanically coupling the drive shaft to the electric motor, the transmission including a collar having an inside diameter configured to receive a portion of the outside diameter of the drive shaft and form capacitive coupling between the transmission and the drive shaft via a gap between the inside diameter of the collar and the outside diameter of the drive shaft;

whereby, any electromagnetic interference created by the inverters is inhibited from traveling along the drive shaft due to the capacitive coupling.

2. The vehicle of claim 1, wherein the inside diameter of the collar is approximately 102 millimeters.

3. The vehicle of claim 1, wherein the outside diameter of the drive shaft is approximately 101.8 millimeters.

4. The vehicle of claim 1, wherein the collar has a length of approximately 154 millimeters.

5. The vehicle of claim 1, wherein the capacitive coupling is approximately 8.5 nanofarads.

6. The vehicle of claim 1, wherein the capacitive coupling provides a low impedance path to ground at 1 MHz.

7. The vehicle of claim 6, wherein the capacitive coupling provides a low impedance path of approximately 1.9 ohms to ground at 1 MHz.

8. The vehicle of claim 1, wherein the collar is mechanically and electrically coupled to the transmission 9. A vehicle, comprising:

an electric motor;

an inverter electrically coupled to the electric motor and providing power to the electric motor;

a drive shaft having a slip yoke;

a transmission mechanically coupling the electric motor to the drive shaft, the transmission including a collar having an inside diameter configured to receive the slip yoke by extending around a portion of an outside diameter of the slip yoke to form capacitive coupling between the transmission and the drive shaft via a gap between the inside diameter of the collar and the outside diameter of the slip yoke; whereby, any electromagnetic interference created by the inverters is inhibited from traveling along the drive shaft due to the capacitive coupling.

10. The vehicle of claim 9, wherein the collar is integrally formed into the transmission.

11. The vehicle of claim 9, wherein the collar is mechanically and electrically coupled to the transmission.

12. The vehicle of claim 9, wherein the capacitive coupling is nominally 8.5 nanofarads.

13. The vehicle of claim 9, wherein the capacitive interface provides a low impedance path to ground at 1 MHz.

14. A vehicle, comprising:

an electric motor;

an inverter electrically coupled to the electric motor and providing power to the electric motor;

a drive shaft;

a transmission mechanically coupling the electric motor to the drive shaft, and having a bushing coupled to the transmission and extending around a portion of the drive shaft, the bushing having an inside diameter proportioned to an outside diameter of the drive shaft to cause capacitive coupling via a gap between the transmission and the drive shaft thereby reducing electromagnetic emissions along the drive shaft;

whereby, any electromagnetic interference created by the inverters is inhibited from traveling along the drive shaft due to the capacitive coupling.

15. The vehicle of claim 14, wherein the inside diameter of the bushing is approximately 102 millimeters.

16. The vehicle of claim 14, wherein the outside diameter of the drive shaft is approximately 101.8 millimeters.

17. The vehicle of claim 14, wherein the capacitive coupling is approximately 8.5 nanofarads.

18. The vehicle of claim 14, wherein the capacitive coupling provides a low impedance path to ground at 1 MHz.

19. The vehicle of claim 14, wherein the bushing extends around a portion of a slip yoke coupled to the drive shaft.

* * * * *